(12) United States Patent
Aruga et al.

(10) Patent No.: US 12,328,128 B2
(45) Date of Patent: Jun. 10, 2025

(54) SAMPLING CIRCUIT, ANALOG-TO-DIGITAL CONVERTER CIRCUIT, AND SEMICONDUCTOR INTEGRATED CIRCUIT

(71) Applicant: Socionext Inc., Kanagawa (JP)

(72) Inventors: Kenta Aruga, Kanagawa (JP); Takeshi Takayama, Kanagawa (JP); Shota Hino, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 269 days.

(21) Appl. No.: 18/301,708

(22) Filed: Apr. 17, 2023

(65) Prior Publication Data

US 2023/0261664 A1    Aug. 17, 2023

Related U.S. Application Data

(63) Continuation of application No. PCT/JP2020/041165, filed on Nov. 4, 2020.

(51) Int. Cl.
*H03M 1/12* (2006.01)
*H03M 1/40* (2006.01)
*H03M 1/46* (2006.01)

(52) U.S. Cl.
CPC ......... *H03M 1/1245* (2013.01); *H03M 1/403* (2013.01); *H03M 1/462* (2013.01)

(58) Field of Classification Search
CPC ....... H03M 1/1245; H03M 1/46; H03M 1/403
USPC ................. 341/144, 155, 120, 118, 172, 153
See application file for complete search history.

(56) References Cited

U.S. PATENT DOCUMENTS

| | | |
|---|---|---|
| 4,803,462 A | 2/1989 | Hester et al. |
| 4,989,002 A | 1/1991 | Tan |
| 9,432,044 B1 | 8/2016 | Lee et al. |

(Continued)

FOREIGN PATENT DOCUMENTS

| | | |
|---|---|---|
| JP | S64-068022 A | 3/1989 |
| JP | 2001-267925 A | 9/2001 |

(Continued)

OTHER PUBLICATIONS

International Search Report (ISR) dated Dec. 8, 2020 issued in International Patent Application No. PCT/JP2020/041165, with English translation.

(Continued)

*Primary Examiner* — Peguy Jean Pierre
(74) *Attorney, Agent, or Firm* — Rimon P.C.

(57) ABSTRACT

A sampling circuit includes: a first capacitor including a first terminal and a second terminal; a second capacitor including a third terminal and a fourth terminal; a first input node configured to receive a first input voltage that is one of a differential input voltage; a second input node configured to receive a second input voltage that is the other of the differential input voltage; a first switch circuit configured to be provided between the first input node and the first terminal; a second switch circuit configured to be provided between the second input node and the third terminal; a third switch circuit configured to be provided between the first terminal and the third terminal; and a fourth switch circuit configured to be provided between the second terminal and the fourth terminal.

14 Claims, 4 Drawing Sheets

(56) References Cited

U.S. PATENT DOCUMENTS

| | | | |
|---|---|---|---|
| 2007/0115159 A1* | 5/2007 | Tachibana | H03M 1/1023 |
| | | | 341/144 |
| 2009/0179699 A1 | 7/2009 | Higuchi | |
| 2010/0265113 A1 | 10/2010 | Yoshioka | |
| 2011/0234433 A1 | 9/2011 | Aruga et al. | |
| 2012/0280841 A1 | 11/2012 | Wang et al. | |
| 2018/0205388 A1 | 7/2018 | Aruga et al. | |

FOREIGN PATENT DOCUMENTS

| | | |
|---|---|---|
| JP | 2007-142863 A | 6/2007 |
| JP | 2010-252247 A | 11/2010 |
| JP | 2011-035944 A | 2/2011 |
| JP | 2011-205230 A | 10/2011 |
| JP | 2012-054855 A | 3/2012 |
| JP | 2014-042358 A | 3/2014 |
| JP | 2014-513496 A | 5/2014 |
| JP | 2017-079451 A | 4/2017 |
| WO | 2007/058011 A1 | 5/2007 |

OTHER PUBLICATIONS

Richard K. Hester et al., "Fully Differential ADS with Rail-to-Rail Common-Mode Range and Nonlinear Capacitor Compensation", IEEE Journal of Solid-State Circuits, vol. 25, No. 1, Feb. 1990, pp. 173-183.

Gilbert Promitzer, "12-bit Low-Power Fully Differential Switched Capacitor Noncalibrating Successive Approximation ADS with 1 MS/s", IEEE Journal of Solid-State Circuits, vol. 36, No. 7, Jul. 2001, pp. 1138-1143.

* cited by examiner

F I G. 6
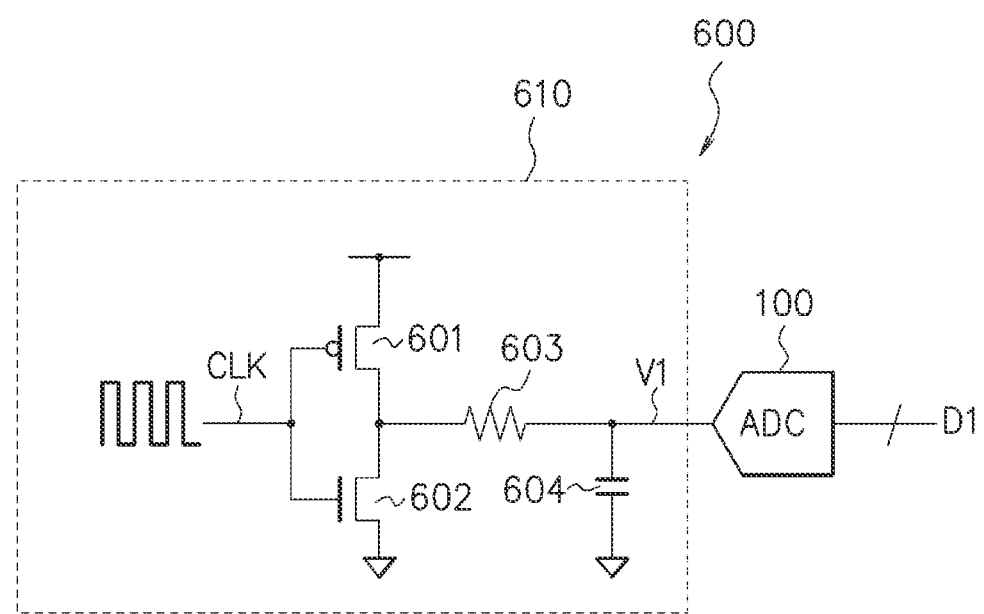

SAMPLING CIRCUIT, ANALOG-TO-DIGITAL CONVERTER CIRCUIT, AND SEMICONDUCTOR INTEGRATED CIRCUIT

CROSS-REFERENCE TO RELATED APPLICATION

This application is a continuation application of International Application PCT/JP2020/041165 filed on Nov. 4, 2020, and designated the U.S., the entire contents of which are incorporated herein by reference.

FIELD

The embodiments discussed herein are directed to a sampling circuit, an analog-to-digital converter circuit, and a semiconductor integrated circuit.

BACKGROUND

Patent Document 1 has described an analog-to-digital converter circuit including a first digital-to-analog converter and a second digital-to-analog converter. The first digital-to-analog converter takes in and retains sample data of a first analog signal and generates a comparison signal serving as an object of comparison of the first analog signal. The second digital-to-analog converter takes in and retains sample data of a second analog signal and generates a comparison signal serving as an object of comparison of the second analog signal. A first switch connects in a mutually openable/closable manner an output side of the first digital-to-analog converter to an output side of the second digital-to-analog converter. A comparator compares, when the first switch is opened, a differential value between the first analog signal and the second analog signal with a differential value between an output signal of the first digital-to-analog converter and an output signal of the second digital-to-analog converter. An electric potential control circuit controls a fluctuation in the electric potentials of a first analog terminal and a second analog terminal.

Patent Document 2 has described an A/D converter including a capacitive main DAC, a resistive sub DAC, and a resistive correction DAC. The capacitive main DAC includes a positive-side capacitive main DAC and a negative-side capacitive main DAC that operate in a complementary fashion, and performs conversion of high-order bits by receiving a differential signal. The resistive sub DAC performs conversion of low-order bits. The resistive correction DAC corrects the capacitive main DAC. A comparator includes a plurality of differential circuits and compares output potentials of the positive-side capacitive main DAC and the negative-side capacitive main DAC. The positive-side capacitive main DAC and the negative-side capacitive main DAC include first capacitive elements each formed from interconnect layers excluding an uppermost interconnect layer. The comparator includes second capacitive elements each arranged between the adjacent differential circuits and formed from interconnect layers including the uppermost interconnect layer.

[Patent Document 1] Japanese Laid-open Patent Publication No. 2007-142863
[Patent Document 2] Japanese Laid-open Patent Publication No. 2014-42358

In Patent Documents 1 and 2, before the sampling operation, a reset operation is performed to discharge the charge accumulated in the capacitive element in the digital-to-analog converter and set the initial charge to 0 (zero).

When the equivalent input resistance of the analog-to-digital converter circuit is not sufficiently high, the digital code converted by the analog-to-digital converter circuit becomes smaller than a normal value. Therefore, it is desirable that the equivalent input resistance of the analog-to-digital converter circuit is sufficiently high. However, Patent Documents 1 and 2 have difficulty in sufficiently increasing the equivalent input resistance of the analog-to-digital converter circuit.

SUMMARY

According to one aspect of the embodiments, there is provided a sampling circuit configured to repeatedly perform a series of operations including a reset operation and a sampling operation and sample a differential input voltage during the sampling operation, the sampling circuit including: a first capacitor including a first terminal and a second terminal; a second capacitor including a third terminal and a fourth terminal; a first input node configured to receive a first input voltage that is one of the differential input voltage; a second input node configured to receive a second input voltage that is the other of the differential input voltage; a first switch circuit configured to be provided between the first input node and the first terminal; a second switch circuit configured to be provided between the second input node and the third terminal; a third switch circuit configured to be provided between the first terminal and the third terminal; and a fourth switch circuit configured to be provided between the second terminal and the fourth terminal, in which during the reset operation, the third switch circuit and the fourth switch circuit are configured to be turned on, and the first switch circuit and the second switch circuit are configured to be turned off.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating a configuration example of a semiconductor integrated circuit according to a third embodiment.

DESCRIPTION OF EMBODIMENTS

First Embodiment

Figure 1:
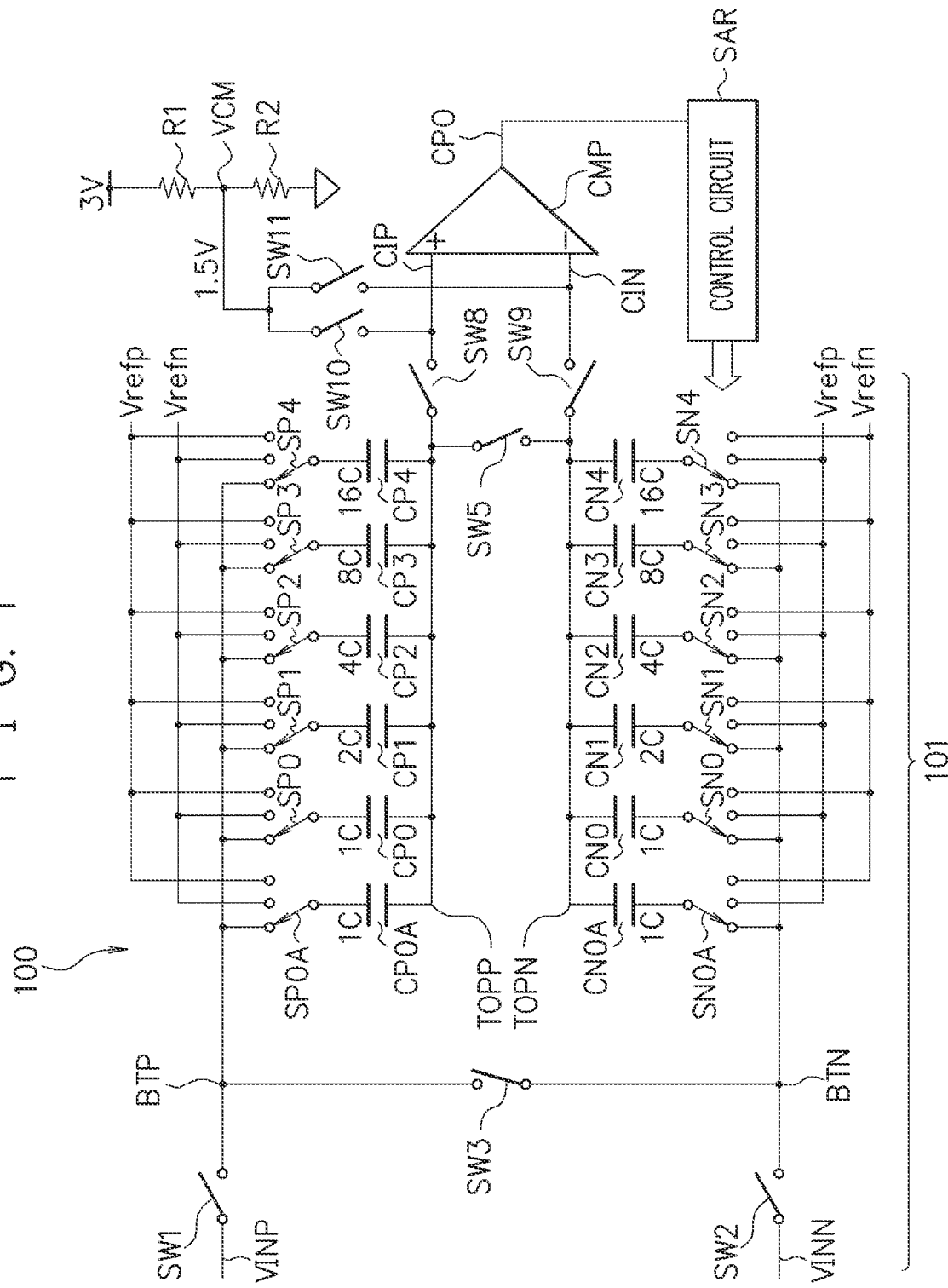
FIG. 1 is a diagram illustrating a configuration example of an analog-to-digital converter circuit according to a first embodiment.

FIG. 1 is a diagram illustrating a configuration example of an analog-to-digital converter circuit 100 according to a first embodiment. The analog-to-digital converter circuit 100 is a 4-bit analog-to-digital converter circuit that includes a sampling circuit 101, switch circuits SW8 to SW11, resistors R1, R2, a comparator CMP, and a control circuit SAR and converts an analog input voltage into a 4-bit digital code.

The sampling circuit 101 includes the switch circuits SW1 to SW3 and SW5, switch circuits SP0A and SP0 to SP4, capacitors CP0A and CP0 to CP4, switch circuits SN0A and SN0 to SN4, and capacitors CN0A and CN0 to CN4.

A relative capacitance value of the capacitors CP0A, CP0, CN0A, and CN0 is 1 C. A relative capacitance value of the capacitors CP1 and CN1 is 2 C. A relative capacitance value of the capacitors CP2 and CN2 is 4 C. A relative capacitance value of the capacitors CP3 and CN3 is 8 C. A relative capacitance value of the capacitors CP4 and CN4 is 16 C.

The switch circuits SP0A and SP0 to SP4 and the capacitors CP0A and CP0 to CP4 form a 4-bit digital-to-analog converter circuit. The switch circuits SN0A and SN0 to SN4 and the capacitors CN0A and CN0 to CN4 also form a 4-bit digital-to-analog converter circuit.

Each of a plurality of the capacitors CP0A and CP0 to CP4 has a first terminal and a second terminal. Each of a plurality of the capacitors CN0A and CN0 to CN4 has a third terminal and a fourth terminal.

A top node TOPP is connected to the second terminals of a plurality of the capacitors CP0A and CP0 to CP4. A top node TOPN is connected to the fourth terminals of a plurality of the capacitors CN0A and CN0 to CN4.

A first input voltage, which is one of a differential input voltage, is input to an input node VINP. A second input voltage, which is the other of the differential input voltage, is input to an input node VINN. The analog-to-digital converter circuit 100 converts the analog differential input voltage into a digital code.

The switch circuit SW1 is provided between the input node VINP and a bottom node BTP. The switch circuit SW2 is provided between the input node VINN and a bottom node BTN. The switch circuit SW3 is provided between the bottom node BTP and the bottom node BTN. The switch circuit SW5 is provided between the top node TOPP and the top node TOPN.

A plurality of the switch circuits SP0A and SP0 to SP4 connect the first terminals of a plurality of the capacitors CP0A and CP0 to CP4 to the bottom node BTP, a reference voltage node Vrefp, or a reference voltage node Vrefn, respectively. The reference voltage node Vrefp is, for example, 3 V. The reference voltage node Vrefn is, for example, 0 V.

A plurality of the switch circuits SN0A and SN0 to SN4 connect the third terminals of a plurality of the capacitors CN0A and CN0 to CN4 to the bottom node BTN, the reference voltage node Vrefp, or the reference voltage node Vrefn, respectively.

The comparator CMP is a differential comparator and includes a pair of input terminals. The switch circuit SW8 is provided between the top node TOPP and a comparison input node CIP connected to one input terminal of the comparator CMP. The switch circuit SW9 is provided between the top node TOPN and a comparison input node CIN connected to the other input terminal of the comparator CMP. In a successive approximation operation, the comparator CMP receives the voltage of the top node TOPP via the switch circuit SW8 and the comparison input node CIP, and receives the voltage of the top node TOPN via the switch circuit SW9 and the comparison input node CIN. The comparator CMP compares the voltage of the top node TOPP and the voltage of the top node TOPN in the successive approximation operation.

The resistor R1 is connected between a 3-V node and a bias voltage node VCM. The resistor R2 is connected between the bias voltage node VCM and a 0-V node. The bias voltage node VCM is 1.5 V.

The switch circuit SW10 is provided between the bias voltage node VCM and the comparison input node CIP. The switch circuit SW11 is provided between the bias voltage node VCM and the comparison input node CIN.

The control circuit SAR controls a plurality of the switch circuits SP0A and SP0 to SP4 and a plurality of the switch circuits SN0A and SN0 to SN4 based on an output signal CP0 of the comparator CMP in the successive approximation operation.

Figure 2:
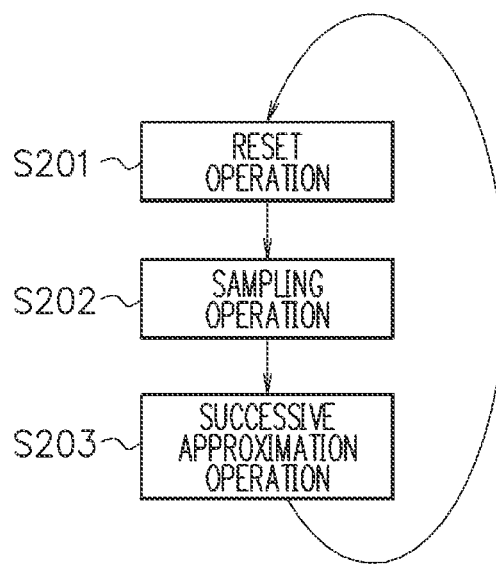
FIG. 2 is a flowchart illustrating a processing method of the analog-to-digital converter circuit.

FIG. 2 is a flowchart illustrating a processing method of the analog-to-digital converter circuit 100 in FIG. 1. The analog-to-digital converter circuit 100 repeatedly performs a series of operations including a reset operation at Step S201, a sampling operation at Step S202, and a successive approximation operation at Step S203.

At Step S201, the analog-to-digital converter circuit 100 performs the reset operation. The switch circuits SW1 and SW2 are turned off. The switch circuits SW3 and SW5 are turned on.

The switch circuits SP0A and SP0 to SP4 connect the first terminals of the capacitors CP0A and CP0 to CP4 to the bottom node BTP, respectively. The switch circuits SN0A and SN0 to SN4 connect the third terminals of the capacitors CN0A and CN0 to CN4 to the bottom node BTN, respectively.

The switch circuits SW8 and SW9 are turned off. The switch circuits SW10 and SW11 are turned on.

Initial charges remain in the capacitors CP0A and CP0 to CP4 and the capacitors CN0A and CN0 to CN4. The initial charge is the charge sampled in the previous sampling operation at Step S202.

This reset operation does not reset the initial charges in the capacitors CP0A and CP0 to CP4 and the capacitors CN0A and CN0 to CN4 to 0 (zero), and the initial charges are redistributed. Since the switch circuits SW3 and SW5 are turned on, the charge amount of the capacitors CP0A and CP0 to CP4 and the charge amount of the capacitors CN0A and CN0 to CN4 are equal.

Then, at Step S202, the analog-to-digital converter circuit 100 performs the sampling operation of the differential input voltage. The switch circuit SW3 is turned off. The switch circuit SW5 remains on. The switch circuits SW1 and SW2 are turned on.

The switch circuits SP0A and SP0 to SP4 connect the first terminals of the capacitors CP0A and CP0 to CP4 to the bottom node BTP, respectively. The switch circuits SN0A and SN0 to SN4 connect the third terminals of the capacitors CN0A and CN0 to CN4 to the bottom node BTN, respectively.

The switch circuits SW8 and SW9 are turned off. The switch circuits SW10 and SW11 are turned on.

The input voltage of the input node VINP is applied to the first terminals of the capacitors CP0A and CP0 to CP4. The input voltage of the input node VINN is applied to the third terminals of the capacitors CN0A and CN0 to CN4. Since the switch circuit SW5 is on, the top nodes TOPP and TOPN become a common potential to the input voltage of the input node VINP and the input voltage of the input node VINN.

Here, there is explained in this embodiment the case where it is known in advance that the input voltage of the input node VINP is equal to or more than the input voltage of the input node VINN.

In the capacitors CP0A and CP0 to CP4, a charge based on the input voltage of the input node VINP is accumulated. In the capacitors CN0A and CN0 to CN4, a charge based on the input voltage of the input node VINN is accumulated. Since the switch circuit SW5 is on, the top nodes TOPP and TOPN become a common potential to the input voltages of the input nodes VINP and VINN.

Figure 3:
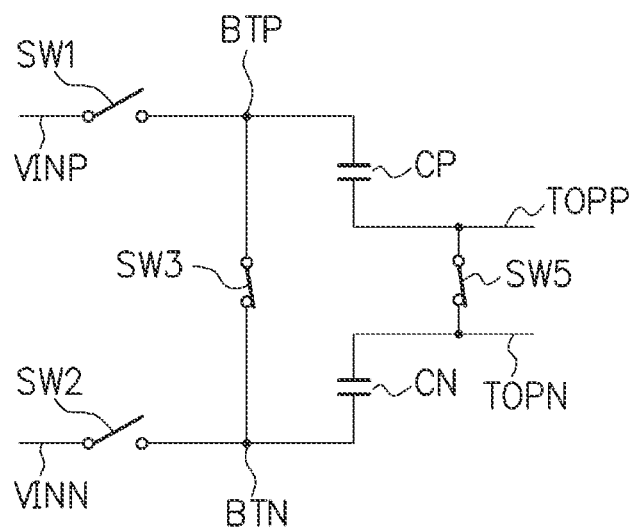
FIG. 3 is a circuit diagram illustrating an equivalent circuit of the analog-to-digital converter circuit.

FIG. 3 is a diagram illustrating an equivalent circuit of the analog-to-digital converter circuit 100 in FIG. 1 in the reset operation at Step S201 in FIG. 2. A capacitor CP in FIG. 3 corresponds to the capacitors CP0A and CP0 to CP4 in FIG. 1. A capacitor CN in FIG. 3 corresponds to the capacitors CN0A and CN0 to CN4 in FIG. 1.

The capacitor CP is connected between the top node TOPP and the bottom node BTP. The capacitor CN is connected between the top node TOPN and the bottom node BTN.

The switch circuit SW1 disconnects the connection between the input node VINP and the bottom node BTP. The switch circuit SW2 disconnects the connection between the input node VINN and the bottom node BTN. The switch circuit SW3 connects the bottom nodes BTP and BTN. The switch circuit SW5 connects the top nodes TOPP and TOPN.

Before the reset operation at Step S201, initial charges remain in the capacitors CP and CN. The initial charge is the charge accumulated in the previous sampling operation at Step S202.

In the reset operation at Step S201, the switch circuits SW1 and SW2 are turned off, and the switch circuits SW3 and SW5 are turned on. Since the capacitor CP and the capacitor CN have the same capacitance value, the initial charges in the capacitors CP and CN are evenly distributed to the capacitors CP and CN.

In the sampling operation at Step S202, the switch circuit SW3 is turned off and the switch circuits SW1 and SW2 are turned on. Then, the bottom node BTP is connected to the input node VINP. The bottom node BTN is connected to the input node VINN. The top nodes TOPP and TOPN become the common potential (VINP+VINN)/2 of the input voltages of the input nodes VINP and VINN.

Figure 4:
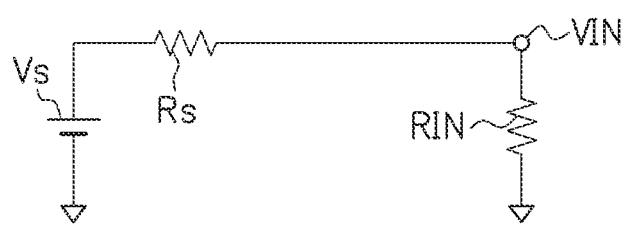
FIG. 4 is an equivalent circuit diagram including an equivalent input resistance, a signal source voltage, and a signal source resistance of the analog-to-digital converter circuit.

FIG. 4 is an equivalent circuit diagram including an equivalent input resistance RIN, a signal source voltage Vs, and a signal source resistance Rs of the analog-to-digital converter circuit 100 in FIG. 1. An input node VIN in FIG. 4 corresponds to the input nodes VINP and VINN in FIG. 1. The equivalent input resistance RIN is connected between the input node VIN and the reference potential node. The signal source voltage Vs is the voltage of a signal source of the input voltage of the input node VIN. The signal source resistance Rs is the resistance of the signal source of the input voltage of the input node VIN. The equivalent input resistance RIN is connected in series with the signal source resistance Rs.

The voltage of the input node VIN is a voltage obtained by dividing the signal source voltage Vs by the signal source resistance Rs and the equivalent input resistance RIN. Therefore, if the equivalent input resistance RIN is sufficiently high, the voltage of the input node VIN becomes substantially the same as the signal source voltage Vs, and the conversion result of the analog-to-digital converter circuit 100 becomes an appropriate value.

However, when the equivalent input resistance RIN is low, the voltage of the input node VIN becomes lower than the signal source voltage Vs, and the conversion result of the analog-to-digital converter circuit 110 becomes small. Therefore, it is desirable that the equivalent input resistance RIN is sufficiently high.

In the sampling operation at Step S202, the charge amount that the capacitors CP and CN charge from the input nodes VINP and VINN is the difference between the charge amount in the capacitors CP and CN based on the input voltages of the input nodes VINP and VINN in the previous sampling operation and the charge amount in the capacitors CP and CN based on the input voltages of the input nodes VINP and VINN in this sampling operation. Therefore, the charge amount that the capacitors CP and CN charge from the input nodes VINP and VINN only needs to be small, so that the equivalent input resistance RIN of the analog-to-digital converter circuit 100 can be made sufficiently high to reduce the sampling operation time.

In contrast to this, there is explained the case where the charge amounts in the capacitors CP and CN are reset to 0 (zero) at Step S201 tentatively. In this case, at Step S202, the capacitors CP and CN start charging from a state where the charge amount is 0 (zero). Therefore, the charge amount that the capacitors CP and CN charge from the input nodes VINP and VINN increases, resulting in a lower equivalent input resistance RIN of the analog-to-digital converter circuit 100 and a longer sampling operation time.

The sampling operation at Step S202 is explained. The total capacitance value of the capacitors CP0A and CP0 to CP4 is 1 C+1 C+2 C+4 C+8 C+16 C=32 C. The total capacitance value of the capacitors CN0A and CN0 to CN4 is also 32 C, which is the same as the total capacitance value of the capacitors CP0A and CP0 to CP4.

Since the switch circuit SW5 is on, the potentials of the top nodes TOPP and TOPN become the input common potential ((VINP+VINN)/2). Here, VINP and VINN represent the potential of the input node VINP and the potential of the input node VINN, respectively.

A charge amount QSAMPP accumulated in the top node TOPP of the capacitors CP0A and CP0 to CP4 is expressed by Equation (1).

$$QSAMPP = -32C(VINP - (VINP + VINN)/2) = -32C(VINP - VINN)/2 \quad (1)$$

A charge amount QSAMPN accumulated in the top node TOPN of the capacitors CN0A and CN0 to CN4 is expressed by Equation (2).

$$QSAMPN = -32C(-VINP+VINN)/2 \quad (2)$$

That is, by setting the potentials of the top nodes TOPP and TOPN to the input common potential (VINP+VINN)/2, the charge amounts QSAMPP and QSAMPN are equal in absolute value and opposite in positive/negative sign.

Then, at Step S203 in FIG. 2, the analog-to-digital converter circuit 100 performs the successive approximation operation. The switch circuit SW5 is turned off. Thereafter, the switch circuits SW1 and SW2 are also turned off. When the switch circuit SW5 is first turned off, the top nodes TOPP and TOPN are brought into a floating state, so that the charges of the top node TOPP of the capacitors CP0A and CP0 to CP4 and the top node TOPN of the capacitors CN0A and CN0 to CN4 are preserved.

Then, the switch circuits SP0A and SP0 to SP4 are brought into a floating state. The switch circuits SN0A and SN0 to SN4 are also brought into a floating state. The switch circuit SW3 is turned on. The switch circuits SW10 and SW11 are turned off. The switch circuits SW8 and SW9 are turned on. This completes the preparation for successive approximation by the comparator CMP.

The switch circuits SW10 and SW11 apply the 1.5-V bias voltage of the bias voltage node VCM to the comparison input nodes CIP and CIN of the comparator CMP during the sampling operation.

Since VINP−VINN>=0 is established, the switch circuit SP4 connects the first terminal of the capacitor CP4 to the reference voltage node Vrefp. The switch circuit SN4 connects the third terminal of the capacitor CN4 to the reference voltage node Vrefn.

The switch circuits SP0 to SP3 are connected to the reference voltage node Vrefp when the bit of the corresponding digital code is 1, and are connected to the reference voltage node Vrefn when the bit of the corresponding digital code is 0 (zero). To generate two's complement, the switch circuit SP0A, which generates a 1-bit addition value, is connected to the reference voltage node Vrefn (corresponding to the bit value "0" of the digital code). This is because there is no need to generate two's complement data.

The switch circuits SN0 to SN3 are connected to the reference voltage node Vrefn when the bit of the corresponding digital code is 1, and are connected to the reference voltage node Vrefp when the bit of the corresponding digital code is 0 (zero). Since VINP−VINN>=0 is established, the switch circuit SN0A is connected to the reference voltage node Vrefp (corresponding to the bit value "0" of the digital code). This is to always generate two's complement data.

Since VINP>VINN is established, the potential of the top node TOPP is always a positive number. Therefore, the switch circuit SP0A is connected to the reference voltage node Vrefn. Similarly, since the top node TOPN is always a negative number, the switch circuit SN0A is connected to the reference voltage node Vrefp.

Since VINP>VINN is assumed, as for the comparison in the comparator CMP, the comparator CMP starts comparison, for example, with VINP>VINN and the reference voltage/2, and if (VINP−VINN) is greater than the reference voltage/2, the comparator CMP compares the reference voltage×¾ and (VINP−VINN). If (VINP−VINN) is smaller than the reference voltage/2, the comparator CMP compares the reference voltage×¼ and (VINP−VINN). If (VINP−VINN) is greater than the reference voltage×¼ tentatively, the comparator CMP compares the reference voltage×⅜ and (VINP−VINN). Alternatively, if (VINP−VINN) is smaller than the reference voltage×¼, the comparator CMP compares the reference voltage×⅛ and (VINP−VINN). That is, the magnitude relation between the potential difference of (VINP−VINN) and the potential obtained by dividing the reference voltage (Vrefp−Vrefn) is determined, the range of the value of the sampled potential difference of (VINP−VINN) is sequentially narrowed, and then the final digital code is determined.

Next, there is explained a method of determining the MSB (Most Significant Bit) of the digital code. The switch circuit SP4 is connected to the reference voltage node Vrefp. The switch circuits SP0 to SP2 and SP0A are connected to the reference voltage node Vrefn. The switch circuit SP3 is connected to the reference voltage node Vrefp. The first terminals of the capacitors CP0A and CP0 to CP2 with the total capacitance value of 8 C are connected to the reference voltage node Vrefn. The first terminals of the capacitors CP3 and CP4 with the total capacitance value of 24 C are connected to the reference voltage node Vrefp. Since the charge amount QSAMPP in Equation (1) is preserved, a potential Vtp of the top node TOPP at this time is given by Equation (3). Here, Vrefp and Vrefn represent the potentials of the reference voltage nodes Vrefp and Vrefn, respectively.

$$-24C(Vrefp-Vtp)+8C(Vtp-Vrefn)=-32C(VINP-VINN)/2$$

$$Vtp=-(VINP-VINN)/2+(Vrefp+Vrefn)/2+(Vrefp-Vrefn)/(2\times 2) \quad (3)$$

The switch circuit SN4 is connected to the reference voltage node Vrefn. The switch circuits SN0 to SN2 and SN0A are connected to the reference voltage node Vrefp. The switch circuit SN3 is connected to the reference voltage node VrefN. The third terminals of the capacitors CN0A and CN0 to CN2 with the total capacitance value of 8 C are connected to the reference voltage node Vrefp. The third terminals of the capacitors CN3 and CN4 with the total capacitance value of 24 C are connected to the reference voltage node Vrefn. Since the charge amount QSAMPN in Equation (2) is preserved, a potential Vtn of the top node TOPN at this time is given by Equation (4).

$$-8C(Vrefp-Vtp)+24C(Vtp-Vrefn)=-32C(VINP-VINN)/2$$

$$Vtn=(VINP-VINN)/2+(Vrefp+Vrefn)/2-(Vrefp-Vrefn)/(2\times 2) \quad (4)$$

The potential of the comparison input node CIP becomes the potential Vtp. The potential of the comparison input node CIN becomes the potential Vtn. The comparator CMP outputs a difference potential Vtp−Vtn between the potential Vtp and the potential Vtn as the output signal CP0, as illustrated in Equation (5).

$$Vtp-Vtn=-(VINP-VINN)+(Vrefp-Vrefn)/2 \quad (5)$$

That is, the comparator CMP outputs the magnitude relation between (VINP−VINN) and (Vrefp−Vrefn)/2 as the output signal CP0. Based on the output signal CP0, the control circuit SAR determines the most significant bit of the digital code to be "1" if (VINP−VINN) is equal to or more than (Vrefp−Vrefn)/2. Further, based on the output signal CP0, the control circuit SAR determines the most significant bit of the digital code to be "0" if (VINP−VINN) is smaller than (Vrefp−Vrefn)/2. The most significant bit of the digital code corresponds to the switch circuits SP3 and SN3.

Next, there is explained a method of determining bits after the most significant bit. There is explained a method of determining the bit (second most significant bit) corresponding to the switch circuits SP2 and SN2.

It is supposed that the most significant bit of the digital code corresponding to the switch circuits SP3 and SN3 is determined to be 1 and (VINP−VINN) is equal to or more than (Vrefp−Vrefn)/2. In this case, the comparator CMP compares (VINP−VINN) and (Vrefp−Vrefn)×¾ and examines the magnitude relation therebetween to narrow the range of the value of (VINP−VINN).

Specifically, the switch circuit SP4 is connected to the reference voltage node Vrefp. The switch circuits SP0A, SP0, and SP1 are connected to the reference voltage node Vrefn. The switch circuits SP2 and SP3 are connected to the reference voltage node Vrefp. The first terminals of the capacitors CP0A, CP0, and CP1 with the total capacitance value of 4 C are connected to the reference voltage node Vrefn. The first terminals of the capacitors CP2 to CP4 with the total capacitance value of 28 C are connected to the reference voltage node Vrefp. The potential Vtp of the top node TOPP at this time is given by Equation (6).

$$-28C(Vrefp-Vtp)+4C(Vtp-Vrefn)=-32C(VINP-VINN)/2$$

$$Vtp=-(VINP-VINN)/2+(Vrefp+Vrefn)/2+3\times(Vrefp-Vrefn)/(2\times4) \quad (6)$$

The switch circuit SN4 is connected to the reference voltage node Vrefn. The switch circuits SN0A, SN0, and SN1 are connected to the reference voltage node Vrefp. The switch circuits SN2 and SN3 are connected to the reference voltage node Vrefn. The third terminals of the capacitors CN0A, CN0, and CN1 with the total capacitance value of 4 C are connected to the reference voltage node Vrefp. The third terminals of the capacitors CN2 to CN4 with the total capacitance value of 28 C are connected to the reference voltage node Vrefn. The potential Vtn of the top node TOPN at this time is given by Equation (7).

$$-4C(Vrefp-Vtp)+28C(Vtp-Vrefn)=32C(VINP-VINN)/2$$

$$Vtn=(VINP-VINN)/2+(Vrefp+Vrefn)/2-3\times(Vrefp-Vrefn)/(2\times4) \quad (7)$$

The potential of the comparison input node CIP becomes the potential Vtp. The potential of the comparison input node CIN becomes the potential Vtn. The comparator CMP outputs a difference potential Vtp−Vtn between the potential Vtp and the potential Vtn as the output signal CP0, as illustrated in Equation (8).

$$Vtp-Vtn=-(VINP-VINN)+3\times(Vrefp-Vrefn)/4 \quad (8)$$

That is, the comparator CMP outputs the magnitude relation between (VINP−VINN) and (Vrefp−Vrefn)×¾ as the output signal CP0. Based on the output signal CP0, the control circuit SAR determines the second most significant bit of the digital code to be "1" if (VINP−VINN) is equal to or more than (Vrefp−Vrefn)×¾. Further, based on the output signal CP0, the control circuit SAR determines the second most significant bit of the digital code to be "0" if (VINP−VINN) is smaller than (Vrefp−Vrefn)×¾. The second most significant bit of the digital code corresponds to the switch circuits SP2 and SN2.

In the same manner blow, the control circuit SAR can control the switch circuits SP0A and SP0 to SP4 and the switch circuits SN0A and SN0 to SN4 to determine the magnitude relation between (VINP−VINN) and the potential obtained by dividing (Vrefp−Vrefn). Thereby, the control circuit SAR can sequentially narrow the range of (VINP−VINN) to determine the final digital code.

As above, in the comparison in the comparator CMP, if (VINP−VINN) is greater than the reference voltage/2, the comparator CMP compares the reference voltage×¾ and (VINP−VINN). If (VINP−VINN) is smaller than the reference voltage/2, the comparator CMP compares the reference voltage×¼ and (VINP−VINN). Furthermore, if (VINP−VINN) is greater than the reference voltage×¼ tentatively, the comparator CMP compares the reference voltage×⅜ and (VINP−VINN). Alternatively, if (VINP−VINN) is smaller than the reference voltage×¼, the comparator CMP compares the reference voltage×⅛ and (VINP−VINN). That is, the magnitude relation between the potential difference of (VINP−VINN) and the potential obtained by dividing the reference voltage (Vrefp−Vrefn) is determined, the range of the value of the sampled potential difference of (VINP−VINN) is sequentially narrowed, and then the final digital code is determined.

After Step S203 in FIG. 2, the analog-to-digital converter circuit 100 returns to Step S201 and performs Steps S201 to S203 repeatedly.

As above, according to this embodiment, in the reset operation at Step S201, the capacitors CP and CN do not reset the charge amount to 0 (zero), but distribute the initial charge.

In the sampling operation at Step S202, the charge amount that the capacitors CP and CN charge from the input nodes VINP and VINN is the difference between the charge amount in the capacitors CP and CN based on the input voltages of the input nodes VINP and VINN in the previous sampling operation and the charge amount in the capacitors CP and CN based on the input voltages of the input nodes VINP and VINN in this sampling operation. Therefore, the charge amount that the capacitors CP and CN charge from the input nodes VINP and VINN only needs to be small, so that the equivalent input resistance RIN of the analog-to-digital converter circuit 100 can be made sufficiently high to reduce the sampling operation time. This makes it possible to inhibit the deterioration in accuracy of the conversion result of the analog-to-digital converter circuit 100.

Second Embodiment

Figure 5:
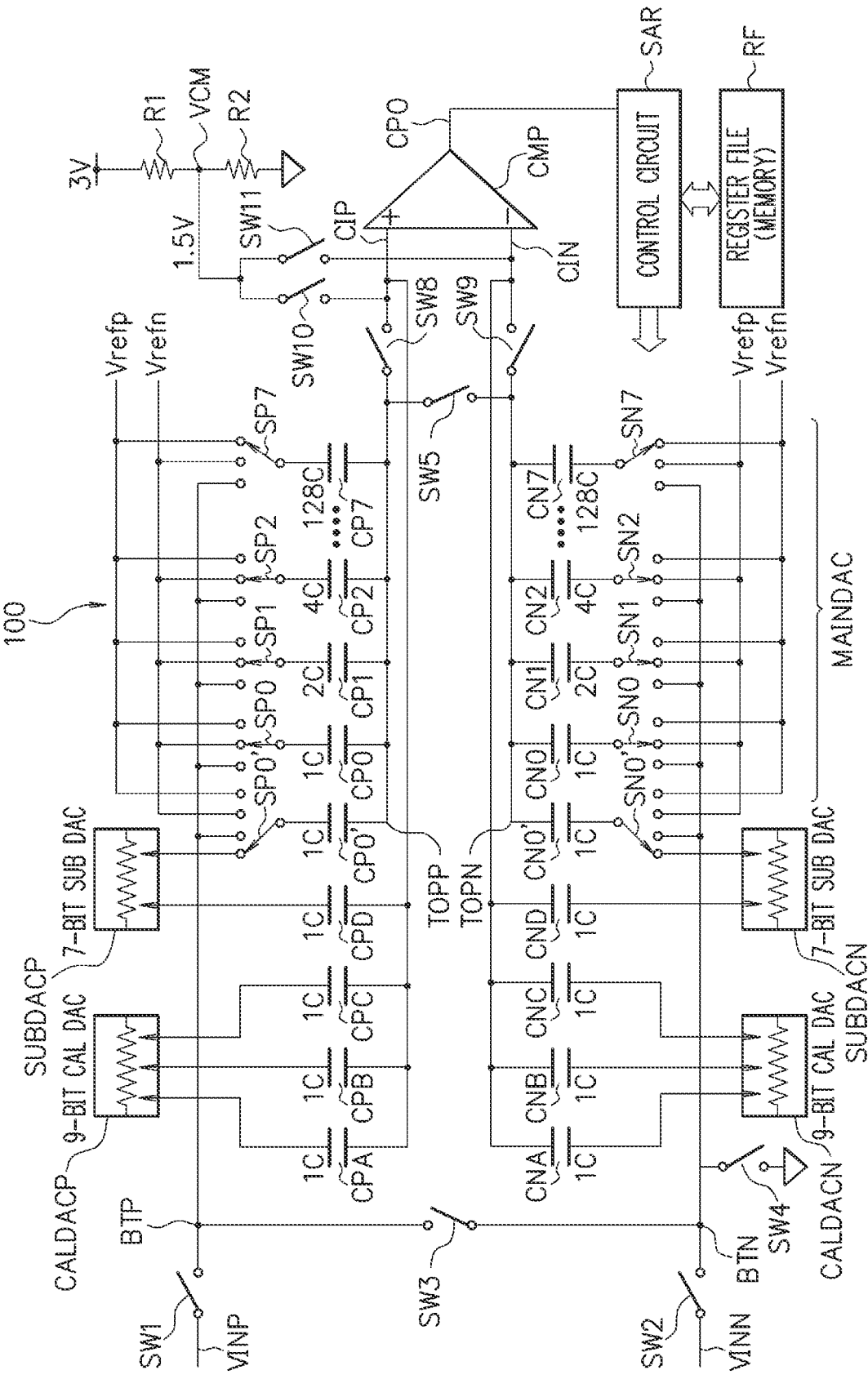
FIG. 5 is a diagram illustrating a configuration example of an analog-to-digital converter circuit according to a second embodiment.

FIG. 5 is a diagram illustrating a configuration example of an analog-to-digital converter circuit 100 according to a second embodiment. The analog-to-digital converter circuit 100 in FIG. 5 is that resistive sub digital-to-analog converter circuits SUBDACP and SUBDACN, resistive correction digital-to-analog converter circuits CALDACP and CALDACN, capacitors CPA to CPD and CNA to CND, a switch circuit SW4, and a register file (memory) RF are added to the analog-to-digital converter circuit 100 in FIG. 1.

Further, a switch circuit SP0' and a capacitor CP0' in FIG. 5 are provided instead of the switch circuit SP0A and the capacitor CP0A in FIG. 1. The relative capacitance value of the capacitor CP0' is 1 C. The switch circuit SP0' connects the first terminal of the capacitor CP0' to the resistive sub digital-to-analog converter circuit SUBDACP, the bottom node BTP, the reference voltage node Vrefp, or the reference voltage node Vrefn.

A switch circuit SN0' and a capacitor CN0' in FIG. 5 are provided instead of the switch circuit SN0A and the capacitor CN0A in FIG. 1. The relative capacitance value of the capacitor CN0' is 1 C. The switch circuit SN0' connects the third terminal of the capacitor CN0' to the resistive sub digital-to-analog converter circuit SUBDACN, the bottom node BTN, the reference voltage node Vrefp, or the reference voltage node Vrefn.

Switch circuits SP0 to SP7 and capacitors CP0 to CP7 in FIG. 5 are provided instead of the switch circuits SP0 to SP4 and the capacitors CP0 to CP4 in FIG. 1. Switch circuits SN0 to SN7 and capacitors CN0 to CN7 in FIG. 5 are provided instead of the switch circuits SN0 to SN4 and the capacitors CN0 to CN4 in FIG. 1. These are a 7-bit capacitive main digital-to-analog converter circuit MAINDAC with positive/negative signs, which is the same as that in the first embodiment.

The analog-to-digital converter circuit 100 is a 14-bit analog-to-digital converter circuit that converts an analog input voltage into a 14-bit digital code. The 14-bit analog-to-digital converter circuit 100 includes the 7-bit capacitive main digital-to-analog converter circuit MAINDAC and the 7-bit resistive sub digital-to-analog converter circuits SUBDACP and SUBDACN. The 7-bit capacitive main digital-to-analog converter circuit MAINDAC converts a digital code of the upper 7 bits out of the 14 bits into an analog voltage. The 7-bit resistive sub digital-to-analog converter circuits SUBDACP and SUBDACN convert a digital code of the lower 7 bits out of the 14 bits into an analog voltage. This makes it possible to reduce the circuit scale of the analog-to-digital converter circuit 100 with high resolution.

The analog-to-digital converter circuit 100 further includes the resistive correction digital-to-analog converter circuits CALDACP and CALDACN. In the 14-bit or more analog-to-digital converter circuit 100, the resistive correction digital-to-analog converter circuits CALDACP and CALDACN correct the manufacturing error of the capacitive main digital-to-analog converter circuit MAINDAC. This allows the analog-to-digital converter circuit 100 to perform a high-resolution analog-to-digital conversion.

The resistive sub digital-to-analog converter circuit SUBDACP outputs a first analog voltage to the comparison input node CIP via the capacitors CPD and CP0' based on the low-order 7-bit digital code of the 14-bit digital code.

The resistive sub digital-to-analog converter circuit SUBDACN outputs a second analog voltage to the comparison input node CIN via the capacitors CND and CN0' based on the low-order 7-bit digital code of the 14-bit digital code.

The resistive correction digital-to-analog converter circuit CALDACP is connected to the comparison input node CIP via the capacitors CPA to CPC, and corrects the voltages of the capacitors CP0' and CP0 to CP7.

The resistive correction digital-to-analog converter circuit CALDACN is connected to the comparison input node CIN via the capacitors CNA to CNC, and corrects the voltages of the capacitors CN0' and CN0 to CN7.

In the analog-to-digital converter circuit 100, of 14 bits of conversion resolution and positive/negative sign bits, the high-order 7 bits and the positive/negative sign bits are determined by the capacitive main digital-to-analog converter circuit MAINDAC, and the low-order 7 bits are determined by the resistive sub digital-to-analog converter circuits SUBDACP and SUBDACN. Incidentally, the resistive sub digital-to-analog converter circuits SUBDACP and SUBDACN have two voltage outputs divided into a high-order-bit part and a low-order-bit part by resistance division in order to reduce the time constant of the output node and speed up the operation.

The high-order-bit voltage output of the resistive sub digital-to-analog converter circuit SUBDACP is connected to the top node TOPP via the capacitor CP0', and the low-order-bit voltage output of the resistive sub digital-to-analog converter circuit SUBDACP is connected to the comparison input node CIP via the capacitor CPD.

Similarly, the high-order-bit voltage output of the resistive sub digital-to-analog converter circuit SUBDACN is connected to the top node TOPN via the capacitor CN0'. Further, the low-order-bit voltage output of the resistive sub digital-to-analog converter circuit SUBDACN is connected to the comparison input node CIN via the capacitor CND.

Incidentally, in the analog-to-digital converter circuit 100, in addition to the capacitive main digital-to-analog converter circuit MAINDAC and the resistive sub digital-to-analog converter circuits SUBDACP and SUBDACN intended for performing the 14-bit conversion, the 9-bit resistive correction digital-to-analog converter circuits CALDACP and CALDACN intended for canceling capacitor mismatch are provided. These resistive correction digital-to-analog converter circuits CALDACP and CALDACN are used to implement the self-calibration function.

The resistive correction digital-to-analog converter circuit CALDACP is divided into three output voltages, which are connected to the comparison input node CIP via the capacitors CPA to CPC respectively. Further, the resistive correction digital-to-analog converter circuit CALDACN is divided into three output voltages, which are connected to the comparison input node CIN via the capacitors CNA to CNC respectively.

Here, since the resolution of the resistive correction digital-to-analog converter circuits CALDACP and CALDACN is higher than that of the resistive sub digital-to-analog converter circuits SUBDACP and SUBDACN by two bits, for example, the resistive correction digital-to-analog converter circuits CALDACP and CALDACN can make a correction for one LSB (least significant bit) of the 14 bits of the analog-to-digital conversion with a resolution four times finer than that of the resistive sub digital-to-analog converter circuits SUBDACP and SUBDACN.

In the successive approximation operation at Step S203 in FIG. 2, bits are determined starting from the most significant bit of the capacitive main digital-to-analog converter circuit MAINDAC, as in the first embodiment. After the high-order 7 bits of the capacitive main digital-to-analog converter circuit MAINDAC are determined, the low-order 7 bits are determined using the resistive sub digital-to-analog converter circuits SUBDACP and SUBDACN.

During the successive approximation at Step S203, the resistive correction digital-to-analog converter circuits CALDACP and CALDACN operate to correct the capacitive main digital-to-analog converter circuit MAINDAC.

The capacitor mismatch of the capacitive main digital-to-analog converter circuit MAINDAC is measured when power is applied to the analog-to-digital converter circuit 100. Data for correcting the measured capacitor mismatch are written in the register file RF.

The resistive sub digital-to-analog converter circuits SUBDACP and SUBDACN each have a voltage output for 4 bits responsible for high-order bits and a voltage output for 3 bits responsible for low-order bits.

The resistive correction digital-to-analog converter circuits CALDACP and CALDACN each have a voltage output for 3 bits responsible for high-order bits, a voltage output for 3 bits responsible for middle-order bits, and a voltage output for 3 bits responsible for low-order bits.

The outputs of the resistive sub digital-to-analog converter circuits SUBDACP and SUBDACN and the resistive correction digital-to-analog converter circuits CALDACP and CALDACN are divided to be capacitively added. Thereby, the time constants of the resistive sub digital-to-analog converter circuits SUBDACP and SUBDACN and the resistive correction digital-to-analog converter circuits CALDACP and CALDACN decrease to obtain the speeding-up effect.

The error of the capacitive main digital-to-analog converter circuit MAINDAC measured by measuring the capacitor mismatch can be converted into a correction amount (correction data) of the capacitor that is responsible for each bit. The correction data are stored in the register file RF.

At the stage of the successive approximation operation at Step S203, as described above, first, the trial and determination of the most significant bit are performed, and then the trial and determination of the second most significant bit are performed, and then the trial and determination of the third most significant bit are further performed. Thereafter, trials and determinations are performed for each of the bits, down to the least significant bit.

The resistive correction digital-to-analog converter circuits CALDACP and CALDACN calculate a correction amount according to the digital code input to the capacitive main digital-to-analog converter circuit MAINDAC at each stage of the successive approximation operation, and perform correction.

Next, there is explained an error correction control operation. When a trial is made on the most significant bit after the sampling operation, a correction value corresponding to the capacitor responsible for the most significant bit is output from the register file RF. The resistive correction digital-to-analog converter circuits CALDACP and CALDACN output voltages based on the value from the register file RF. At the end of the most significant bit comparison period, the comparator CMP finishes the determination and outputs "1" or "0."

At the same time as the period for determining the following second significant bit starts, when the most significant bit is determined to be "1," in a register, the correction value of the most significant bit from the register file RF is stored, and when it is "0," the value of "0" is stored.

Thereafter, in the trial and determination period of the second bit, the register file RF outputs a correction value of the capacitor responsible for the second significant bit. The resistive correction digital-to-analog converter circuits CALDACP and CALDACN output voltages based on the sum of the output value of the register file RF and the value of the register.

In the same manner thereafter, the correction amount according to the digital code of the capacitive main digital-to-analog converter circuit MAINDAC is input to the resistive correction digital-to-analog converter circuits CALDACP and CALDACN. After the high-order bits are determined by the capacitive main digital-to-analog converter circuit MAINDAC, low-order bits are searched by the resistive sub digital-to-analog converter circuits SUBDACP and SUBDACN. The resistive sub digital-to-analog converter circuits SUBDACP and SUBDACN do not need to perform correction because they have a small weight with respect to the dynamic range of the analog-to-digital conversion.

According to this embodiment, the 14-bit analog-to-digital converter circuit 100 includes the 7-bit capacitive main digital-to-analog converter circuit MAINDAC, the 7-bit resistive sub digital-to-analog converter circuits SUBDACP and SUBDACN, and the 9-bit resistive correction digital-to-analog converter circuits CALDACP and CALDACN, which can convert an input analog voltage into a 14-bit digital code.

Third Embodiment

FIG. 6 is a diagram illustrating a configuration example of a semiconductor integrated circuit 600 according to a third embodiment. The semiconductor integrated circuit 600 includes an internal circuit 610 and an analog-to-digital converter circuit 100. The analog-to-digital converter circuit 100 is the analog-to-digital converter circuit 100 in the first or second embodiment.

The internal circuit 610 includes a p-channel field-effect transistor 601, an n-channel field-effect transistor 602, a resistor 603, and a capacitor 604. The p-channel field-effect transistor 601 and the re-channel field-effect transistor 602 form an inverter. The resistor 603 and the capacitor 604 form a first-order RC filter.

The internal circuit 610 is, for example, a duty ratio measuring circuit for a clock signal CLK. When the semiconductor integrated circuit 600 is a radio communication circuit, a phase locked loop circuit (PLL circuit) generates the clock signal CLK and supplies the clock signal CLK to a mixer circuit. The frequency of the clock signal CLK is high, which is 12 GHz or the like, for example.

The clock signal CLK is transmitted from the PLL circuit to a destination circuit while being relayed by, for example, a CMOS inverter or buffer. When the frequency of the clock signal CLK is high, the duty ratio deteriorates as the clock signal CLK passes through the relay. The duty ratio is the ratio of one-cycle period to a high-level period of the clock signal. Typically, the duty ratio of the clock signal CLK is desirably 50%.

For example, in a radio communication circuit that needs high-speed transmission of the clock signal CLK, the deterioration in the duty ratio of the clock signal CLK needs to be adjusted after the radio communication circuit is manufactured. In such a case, it is necessary to accurately measure the current duty ratio of the clock signal CLK for adjustment.

The p-channel field-effect transistor 601 and the n-channel field-effect transistor 602 are the inverter and shape the waveform of the clock signal CLK. The resistor 603 and the capacitor 604 are the first-order RC filter, and smooth the output signal of the inverter and output an analog direct-current voltage V1. When the duty ratio of the clock signal CLK is 50%, the direct-current voltage V1 becomes the average value of the high level of the clock signal CLK and the low level of the clock signal CLK. The duty ratio of the clock signal CLK can be derived based on the direct-current voltage V1.

The internal circuit 610 outputs an analog differential input voltage based on the direct-current voltage V1 to the analog-to-digital converter circuit 100. The analog-to-digital converter circuit 100 converts the differential input voltage based on the input voltage V1 into a digital code D1, as in the first or second embodiment.

The resistor 603 is, for example, 20 kΩ, the capacitor 604 is, for example, 20 pF, and the signal source resistance Rs in FIG. 4 is high, which is, for example, 100 kΩ. Therefore, if the equivalent input resistance RIN in FIG. 4 is low, the direct-current voltage V1 decreases, failing to measure the duty ratio accurately.

Having a sufficiently high equivalent input resistance RIN, the analog-to-digital converter circuit 100 in this embodiment can inhibit the decrease in the direct-current voltage V1 and accurately measure the duty ratio.

Note that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

It is possible to provide a sampling circuit and an analog-to-digital converter circuit capable of sufficiently increasing the equivalent input resistance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A sampling circuit configured to repeatedly perform a series of operations including a reset operation and a sampling operation and sample a differential input voltage during the sampling operation, the sampling circuit comprising:
   a first capacitor including a first terminal and a second terminal;
   a second capacitor including a third terminal and a fourth terminal;
   a first input node configured to receive a first input voltage that is one of the differential input voltage;
   a second input node configured to receive a second input voltage that is the other of the differential input voltage;
   a first switch circuit configured to be provided between the first input node and the first terminal;
   a second switch circuit configured to be provided between the second input node and the third terminal;
   a third switch circuit configured to be provided between the first terminal and the third terminal; and
   a fourth switch circuit configured to be provided between the second terminal and the fourth terminal, wherein
   during the reset operation, the first switch circuit and the second switch circuit are configured to be turned off, and the third switch circuit and the fourth switch circuit are configured to be turned on.

2. The sampling circuit according to claim 1, wherein
   during the sampling operation, the third switch circuit is configured to be turned off and the first switch circuit, the second switch circuit, and the fourth switch circuit are configured to be turned on.

3. An analog-to-digital converter circuit configured to repeatedly perform a series of operations including a reset operation, a sampling operation, and a successive approximation operation and convert an analog input voltage into a first bit-number digital code, the analog-to-digital converter circuit comprising:
   a plurality of first capacitors, each of the first capacitors including a first terminal and a second terminal;
   a plurality of second capacitors, each of the second capacitors including a third terminal and a fourth terminal;
   a first top node configured to be connected to the second terminals of the plurality of first capacitors;
   a second top node configured to be connected to the fourth terminals of the plurality of second capacitors;
   a first input node configured to receive a first input voltage that is one of a differential input voltage;
   a second input node configured to receive a second input voltage that is the other of the differential input voltage;
   a first switch circuit configured to be provided between the first input node and a first bottom node;
   a second switch circuit configured to be provided between the second input node and a second bottom node;
   a third switch circuit configured to be provided between the first bottom node and the second bottom node;
   a fourth switch circuit configured to be provided between the first top node and the second top node;
   a plurality of fifth switch circuits configured to connect the first terminals of the plurality of first capacitors to the first bottom node, a first reference voltage node, or a second reference voltage node respectively;
   a plurality of sixth switch circuits configured to connect the third terminals of the plurality of second capacitors to the second bottom node, the first reference voltage node, or the second reference voltage node respectively;
   a comparator configured to compare a voltage of the first top node and a voltage of the second top node; and
   a control circuit configured to control a plurality of the fifth switch circuits and a plurality of the sixth switch circuits based on an output signal of the comparator during the successive approximation operation, wherein
   during the reset operation, the first switch circuit and the second switch circuit are configured to be turned off, the third switch circuit and the fourth switch circuit are configured to be turned on, the plurality of fifth switch circuits are configured to connect the first terminals of the plurality of first capacitors to the first bottom node respectively, and the plurality of sixth switch circuits are configured to connect the third terminals of the plurality of second capacitors to the second bottom node respectively.

4. The analog-to-digital converter circuit according to claim 3, wherein
   during the sampling operation, the third switch circuit is configured to be turned off, the first switch circuit, the second switch circuit, and the fourth switch circuit are configured to be turned on, the plurality of fifth switch circuits are configured to connect the first terminals of the plurality of the first capacitors to the first bottom node respectively, and the plurality of sixth switch circuits are configured to connect the third terminals of the plurality of second capacitors to the second bottom node respectively.

5. The analog-to-digital converter circuit according to claim 3, further comprising:
   a first comparison input node configured to be connected to one input terminal of the comparator;
   a second comparison input node configured to be connected to the other input terminal of the comparator;
   a seventh switch circuit configured to be provided between the first top node and the first comparison input node; and
   an eighth switch circuit configured to be provided between the second top node and the second comparison input node.

6. The analog-to-digital converter circuit according to claim 5, further comprising:
   a ninth switch circuit configured to be provided between a bias voltage node and the first comparison input node; and
   a tenth switch circuit configured to be provided between the bias voltage node and the second comparison input node.

7. The analog-to-digital converter circuit according to claim 3, further comprising:
   a first resistive sub digital-to-analog converter circuit configured to output a first analog voltage to the first comparison input node based on a low-order-bit digital code of the first bit-number digital code; and
   a second resistive sub digital-to-analog converter circuit configured to output a second analog voltage to the second comparison input node based on the low-order-bit digital code.

8. The analog-to-digital converter circuit according to claim 3, further comprising:
   a first resistive correction digital-to-analog converter circuit configured to be connected to the first comparison input node and correct voltages of the plurality of first capacitors; and a second resistive correction digital-to-analog converter circuit configured to be connected to the second comparison input node and correct voltages of the plurality of second capacitors.

9. A semiconductor integrated circuit, comprising:
an internal circuit configured to output an analog differential input voltage; and
an analog-to-digital converter circuit configured to convert the differential input voltage into a first bit-number digital code, wherein
the analog-to-digital converter circuit is configured to perform a series of operations including a reset operation, a sampling operation, and a successive approximation operation, the analog-to-digital converter circuit includes:
a plurality of first capacitors, each of the first capacitors including a first terminal and a second terminal;
a plurality of second capacitors, each of the second capacitors including a third terminal and a fourth terminal;
a first top node configured to be connected to the second terminals of the plurality of first capacitors;
a second top node configured to be connected to the fourth terminals of the plurality of second capacitors;
a first input node configured to receive a first input voltage that is one of the differential input voltage;
a second input node configured to receive a second input voltage that is the other of the differential input voltage;
a first switch circuit configured to be provided between the first input node and a first bottom node;
a second switch circuit configured to be provided between the second input node and a second bottom node;
a third switch circuit configured to be provided between the first bottom node and the second bottom node;
a fourth switch circuit configured to be provided between the first top node and the second top node;
a plurality of fifth switch circuits configured to connect the first terminals of the plurality of first capacitors to the first bottom node, a first reference voltage node, or a second reference voltage node respectively;
a plurality of sixth switch circuits configured to connect the third terminals of the plurality of second capacitors to the second bottom node, the first reference voltage node, or the second reference voltage node respectively;
a comparator configured to compare a voltage of the first top node and a voltage of the second top node; and
a control circuit configured to control the plurality of fifth switch circuits and the plurality of sixth switch circuits based on an output signal of the comparator during the successive approximation operation, and
during the reset operation, the first switch circuit and the second switch circuit are configured to be turned on, the third switch circuit and the fourth switch circuit are configured to be turned off, the plurality of fifth switch circuits are configured to connect the first terminals of the plurality of first capacitors to the first bottom node respectively, and a plurality of the sixth switch circuits are configured to connect the third terminals of the plurality of second capacitors to the second bottom node respectively.

10. The semiconductor integrated circuit according to claim 9, wherein
during the sampling operation, the third switch circuit is configured to be turned off, the first switch circuit, the second switch circuit, and the fourth switch circuit are configured to be turned on, the plurality of fifth switch circuits are configured to connect the first terminals of the plurality of first capacitors to the first bottom node respectively, and the plurality of sixth switch circuits are configured to connect the third terminals of the plurality of second capacitors to the second bottom node respectively.

11. The semiconductor integrated circuit according to claim 9, wherein
the analog-to-digital converter circuit further includes:
a first comparison input node configured to be connected to one input terminal of the comparator;
a second comparison input node configured to be connected to the other input terminal of the comparator;
a seventh switch circuit configured to be provided between the first top node and the first comparison input node; and
an eighth switch circuit configured to be provided between the second top node and the second comparison input node.

12. The semiconductor integrated circuit according to claim 11, wherein
the analog-to-digital converter circuit further includes:
a ninth switch circuit configured to be provided between a bias voltage node and the first comparison input node; and
a tenth switch circuit configured to be provided between the bias voltage node and the second comparison input node.

13. The semiconductor integrated circuit according to claim 9, wherein
the analog-to-digital converter circuit further includes:
a first resistive sub digital-to-analog converter circuit configured to output a first analog voltage to the first comparison input node based on a low-order-bit digital code of the first bit-number digital code; and
a second resistive sub digital-to-analog converter circuit configured to output a second analog voltage to the second comparison input node based on the low-order-bit digital code.

14. The semiconductor integrated circuit according to claim 9, wherein
the analog-to-digital converter circuit further includes:
a first resistive correction digital-to-analog converter circuit configured to be connected to the first comparison input node and correct voltages of the plurality of first capacitors; and
a second resistive correction digital-to-analog converter circuit configured to be connected to the second comparison input node and correct voltages of the plurality of second capacitors.

* * * * *